US00RE37033E

(19) United States
(12) Reissued Patent
Tajima et al.

(10) Patent Number: US RE37,033 E
(45) Date of Reissued Patent: Jan. 30, 2001

(54) PIGMENT-DISPERSED COLOR-FILTER COMPOSITION COMPRISING AN ALKALI-SOLUBLE BLOCK COPOLYMER AS A BINDER

(75) Inventors: Yusuke Tajima, Tokyo; Nobuo Bessho; Fumitaka Takinishi, both of Yokohama; Hideaki Masuko; Yasuaki Yokoyama, both of Yokkaichi, all of (JP)

(73) Assignee: JSR Corporation, Tokyo (JP)

(21) Appl. No.: 08/778,687

(22) Filed: Jan. 3, 1997

Related U.S. Patent Documents

Reissue of:
(64) Patent No.: 5,368,976
Issued: Nov. 29, 1994
Appl. No.: 08/036,253
Filed: Mar. 24, 1993

(30) Foreign Application Priority Data

Mar. 27, 1992 (JP) ..... 4-100155
Jun. 11, 1992 (JP) ..... 4-151848
Jun. 24, 1992 (JP) ..... 4-166165

(51) Int. Cl.[7] ..... G03F 7/012; G03F 7/033; G03F 7/016; G03F 7/008

(52) U.S. Cl. ..... 430/196; 430/7; 430/197; 430/270.1; 430/281.1; 430/288.1; 430/910; 430/176

(58) Field of Search ..... 430/288.1, 281.1, 430/196, 197, 270.1, 7, 910

(56) References Cited

U.S. PATENT DOCUMENTS 4,460,675 * 7/1984 Gruetzmacher et al. ..... 430/283.1
4,614,701 * 9/1986 Mori et al. ..... 430/197
4,837,098 * 6/1989 Shinamura et al. ..... 430/7
4,902,726 * 2/1990 Hayashi et al. ..... 430/281.1
4,908,296 * 3/1990 Nebe et al. ..... 430/910
4,943,512 * 7/1990 Kawabata et al. ..... 430/197
5,047,309 * 9/1991 Koike et al. ..... 430/176
5,055,377 * 10/1991 Littmann et al. ..... 430/281.1
5,096,801 * 3/1992 Koya et al. ..... 430/293
5,110,710 * 5/1992 Tomita et al. ..... 430/281.1
5,190,845 * 3/1993 Hashimoto et al. ..... 430/288.1
5,698,361 * 12/1997 Aoshima et al. ..... 430/176

FOREIGN PATENT DOCUMENTS

0076028 * 4/1983 (EP) .
0157374 * 10/1985 (EP) .
0480335 * 4/1992 (EP) .

* cited by examiner

*Primary Examiner*—John S. Chu
(74) *Attorney, Agent, or Firm*—Oblon, Spivak, McClelland, Maier & Neustadt, P.C.

(57) ABSTRACT

The present invention provides a pigment dispersed color-filter composition containing a binder polymer such as an alkali-soluble block copolymer; a radiation-sensitive compound; and a pigment. The pigment-dispersed color-filter composition which further contains an organic medium, or an organic medium and a carboxylic acid is also provided.

5 Claims, No Drawings

PIGMENT-DISPERSED COLOR-FILTER COMPOSITION COMPRISING AN ALKALI-SOLUBLE BLOCK COPOLYMER AS A BINDER

Matter enclosed in heavy brackets [ ] appears in the original patent but forms no part of this reissue specification; matter printed in italics indicates the additions made by reissue.

DETAILED DESCRIPTION OF THE INVENTION

The present invention relates to a pigment-dispersed composition for a color-filter (to be referred to as "pigment-dispersed color-filter composition" hereinafter). More specifically, it relates to a pigment-dispersed color-filter composition useful for the production of color filters of a liquid crystal display and a charge coupled device.

For producing a color filter of a liquid display, a dyeing method, a printing method and an electrodeposition method are known. In recent years, a photolithographic method using a pigment-dispersed photosensitive composition is particularly attracting attention in terms of color purity, dimensional accuracy and process resistance ("Color Liquid Crystal Display" page 173, edited by Shunsuke Kobayashi, published by Sangyotosho, 1990).

However, the photolithographic method using a pigment-dispersed photosensitive composition having a variety of advantages is still required to have further improved performances for stably producing highly accurate and fine color filters. That is, a highly accurate and fine pixel is liable to peel off a substrate in a development step when a colored pixel of a color filter is formed by applying a pigment-dispersed photosensitive composition to the substrate, exposing the coating and developing it, and the color filter is thus liable to have a deficiency. On the other hand, when an attempt is made to improve the adhesion of a highly accurate and fine pixel to a substrate, the solubility of a non-pixel portion which should be dissolved away in a developer solution tends to decrease, and a so-called surface soiling and resin-remaining are liable to occur. In this case, it is general practice to apply a physical stimulus by rubbing the coating with a soft substance such as sponge or the like for removing the surface soiling and remaining resin. However, this practice is undesirable, since it involves toughening and occurrence of dust on the color filter surface, which ends up in a decrease in the yields of color filters.

When a color filter is produced from a radiation-sensitive composition, it is conventionally produced as follows. A light shielding layer in a desired pattern is formed on a glass substrate on which an $SiO_2$ film or the like has been formed to prevent the elution of sodium ion. A radiation-sensitive composition is spin-coated on the light shielding layer to form a coating, and the coating is heated (prebaked) and dried. The so-prepared dried coating (to be sometimes referred to as "dry coating" hereinafter) is exposed and developed to form a pixel of each color.

In the so-obtained dry coating formed on the substrate, the thickness of its central portion and the thickness of its marginal portion sometimes differs by 0.2 $\mu$m or more, and striation (streaks) sometimes occurs. It is therefore difficult to produce a dry coating having a uniform thickness. Further, an unevenness having a depth of approximately 300 to 500Å is sometimes formed on the dry coating surface, and the dry coating surface is inferior in surface smoothness. When the surface of the coating formed by spin coating has a nonuniform thickness or fine evenness, a color filter obtained by developing the dry coating has inferior transparency.

For this reason, in forming a color filter on a substrate surface, it is therefore desired to develop a radiation-sensitive composition for a color fitter, which is capable of forming a dry coating having a uniform thickness and having an excellently smooth surface.

When a conventional color filter is produced from a radiation-sensitive composition, a coating of the composition is developed with an alkaline aqueous solution. In this case, an undissolved substance from the radiation-sensitive composition sometimes remains on a non-pixel portion of the substrate. When an undissolved substance from the radiation-sensitive composition remains on the non-pixel portion of the substrate, the color filter shows a decline in transmittance or a decrease in contrast. When a color filter is produced, generally, pixels of three colors are consecutively produced by consecutively forming coatings of radiation-sensitive compositions each of which has a hue of red, blue or green. However, when an undissolved substance of the radiation-sensitive composition for forming a pixel of one of the colors remains on the substrate, a pixel of other color subsequently formed on the substrate where the undissolved substance remains is inferior in adhesion to the substrate and hence, it may peel off. The so-remaining undissolved radiation-sensitive composition on a non-pixel portion of the substrate surface is one of the reasons for decreasing the yields of color filters.

It is therefore an object of the present invention to provide a novel pigment-dispersed color-filter composition.

It is another object of the present invention to provide a novel pigment-dispersed color-filter composition which gives pixels having excellent adhesion to a substrate and is free of surface soiling and a remaining composition in development.

It is further another object of the present invention to provide a pigment-dispersed color-filter composition which gives a color filter having little difference in thickness between its central portion and its marginal portion and having excellent surface smoothness.

Further, it is another object of the present invention to provide to a pigment-dispersed color-filter composition which is capable of uniformly forming pixels having excellent adhesion to a substrate without leaving an undissolved substance of the composition on a non-pixel portion when a color filter is produced.

It is still further another object of the present invention to provide a novel pigment-dispersed color-filter composition useful for producing a color filter for a liquid crystal display and a charge coupled device.

Other objects and advantages of the present invention will be apparent from the following description.

According to the present invention, the above objects and advantages of the present invention will be achieved, first, by a novel pigment-dispersed color-filter composition (to be referred to as "first composition" hereinafter) comprising:

(A) an alkali-soluble block copolymer composed of a block having an acid group and a block having no acid group, (B) a radiation-sensitive compound, and (C) a pigment.

In the first composition of the present invention, an alkali-soluble block copolymer (A) composed of a block having an acid group and a block having no acid group is used as a binder.

The block having an acid group is composed of a homopolymer formed from at least one monomer having an acid group such as an ethylenically unsaturated carboxylic acid and ethylenically unsaturated sulfonic acid, a copolymer of these or a copolymer formed from the above monomer having an acid group and a monomer having no acid group and being copolymerizable with the above monomer.

In view of ease in controlling the polymerization degree, preferred as the block having an acid group is a homopolymer of an ethylenically unsaturated carboxylic acid or a copolymer formed from an ethylenically unsaturated carboxylic acid and a monomer having no acid group and being copolymerizable therewith.

The ethylenically unsaturated carboxylic acid preferably includes acrylic acid, methacrylic acid, crotonic acid, iraconic acid, maleic acid, fumaric acid, monomethyl maleate and monomethyl fumarate.

The ethylenically unsaturated sulfonic acid includes isoprenesulfonic acid and styrenesulfonic acid.

The monomer having no acid group and being copolymerizable with the above monomer includes aromatic vinyl compounds such as styrene, α-methylstyrene and vinyltoluene; ethylenically unsaturated carboxylic acid esters such as methyl (meth)acrylate, ethyl (meth)acrylate, butyl (meth) acrylate, 2-hydroxyethyl (meth)acrylate and benzyl (meth) acrylate; carboxylic acid vinyl esters such as vinyl acetate and vinyl propionate; vinyl cyanides such as (meth) acrylonitrile and α-chloroacrylonitrile; and aliphatic conjugated dienes such as 1,3-butadiene and isoprene.

The block having no acid group is formed of a polymer or copolymer composed from one of, or a plurality of, the above monomers such as aromatic vinyl compounds, ethylenically unsaturated alkyl carboxylic acid esters, vinyl carboxylic acid esters, vinyl cyanides and aliphatic conjugated dienes; ethylenically unsaturated carboxylic acid aminoalkyl esters such as aminoethyl acrylate; unsaturated aliphatic glycidyl esters such as glycidyl (meth)acrylate; macromonomers having a terminal (meth)acryloyl group such as polystyrene having a terminal (meth)acryloyl group; polymethyl (meth)acrylate having a terminal (meth)acryloyl group, polybutyl (meth)acrylate having a terminal (meth)acryloyl group and polysilicone having a terminal (meth)acryloyl group.

Of polymers or copolymers formed from the above monomers, preferred is a copolymer formed from a macromonomer containing polystyrene, polymethyl (meth) acrylate, polybutyl (meth)acrylate or polysilicone.

The block copolymer can be produced by one of well known polymerization methods such as a living polymerization method, a method in which different blocks are bonded by a functional group reaction and a method using the macromonomer ["Kobunshi Gosei" (Polymer Synthesis), Essence of Polymer and Topics 2, Chapter 12, Junji Furukawa, published by Kagaku Dojin, 1986]. When the macromonomer is used, advantageously, the intended block copolymer can be obtained by a simple radical polymerization method.

When the block copolymer is produced, the amount of the monomer having an acid group is preferably 15 to 50% by weight based on the total amount of the monomers. When this amount is less than 15% by weight, the solubility of the block copolymer in an alkali developer solution is insufficient, and a surface soiling and a resin-remaining are liable to occur on a non-pixel portion. When it exceeds 50% by weight, the solubility of the block copolymer in an alkali developer solution is too high, and pixels are liable to peel off a substrate. The amount of the monomer having an acid group is particularly preferably 20 to 40% by weight.

Concerning the molecular weight of the block copolymer, the weight average molecular weight of the block copolymer as a polystyrene measured by gel permeation chromatography (to be abbreviated as GPC hereinafter) using tetrahydrofuran (THF) as a carrier is preferably 10,000 to 500,000, particularly preferably 20,000 to 300,000.

When the above molecular weight of the block copolymer exceeds 500,000, a scumming is liable to occur around developed pixels, a pattern edge is liable to show insufficient sharpness, and a surface soiling and resin-remaining are liable to occur on a non-pixel portion. When the molecular weight of the block copolymer is less than 10,000, the solubility of the block copolymer in an alkali developer solution is too high under optimum development condition, and the time span for the development is small (for example about 20 to 40 seconds), and the so-called development time margin is liable to decrease.

The radiation-sensitive compound (B) can be selected, for example, from (1) a compound whose molecule is decomposed under irradiation with radiation to free an active compound, generate a chain reaction of unsaturated double bonds and form a three-dimensionally crosslinked compound and (2) a compound whose molecule is decomposed under irradiation with radiation to bond to a C—C bond or a C—H bond by an insertion reaction and form a three-dimensionally crosslinked structure.

The above (1) compound is selected from those compounds which generate radicals, carbene or nitrene, i.e., a photopolymerization initiator and a compound which has polyvalent unsaturated double bonds and is polymerized under irradiation with radiation, i.e., a photopolymerizable monomer and oligomer.

Examples of the photopolymerization initiator include a carbonium compound, an azo or azide compound, an organic sulfur compound, peroxide and a trihalomethane compound.

Specific examples of the carbonium compound include diacetyl, benzyl, benzoin, 2-hydroxy-2-methyl-1-phenylpropan-1-one, 1-(4-isopropylphenyl)-2-hydroxy-2-methylpropan-1-one, 4-(2-hydroxyethoxy)phenyl-2-(hydroxy-2-propyl)ketone, 1-hydroxycyclohexylketone, 2,2-dimethoxy-2-phenylacetophenone, 2-methyl[4-(methylthio)phenyl]-2-morpholino-1-propan-1-one, 2-benzyl-2-dimethylamino-1-(4-morpholinophenyl)-butan-1-one, benzophenone, 4,4'-bis(dimethylamino) benzophenone, 4,4'-bis(diethylamino)benzophenone, 2,4-diethylthioxanthone and 3,3-dimethyl-4-methoxybenzophenone.

Specific examples of the azo or azide compound include azoisobutyronitrile, diazonium, 4-azidobenzaldehyde, 4-azidoacetophenone, 4-azidobenzalacetophenone, 4-azidobenzalacetone, azidopyrene, 4-diazodiphenylamine, 4-diazo-4'-methoxydiphenylamine and 4-diazo-3'-methoxydiphenylamine.

Specific examples of the organic sulfur compound include mercaptan disulfide.

Specific examples of the peroxide include diethyl ether peroxide.

Specific examples of the trihalomethane include 1,3-bis (trichloromethyl)-5-(2'-chlorophenyl)-s-triazine and 1,3-bis (trichloromethyl)-5-(4'-methoxyphenyl)-s-triazine.

Examples of the photopolymerizable monomer or oligomer include polyacryloyl compounds such as trimethylolpropane triacrylate, pentaerythritol triacrylate, trisacryloyloxyethyl phosphate, pentaerythritol tetraacrylate, dipentaerythritol pentaacrylate and dipentaerythritol hexaacrylate; a condensate of 4-azidobenzaldehyde and polyvinyl alcohol, a condensate of 4-azidobenzaldehyde and a phenol novolak resin, and a polymer or copolymer of 4-acryloylphenylcinnamoyl ester.

The above (2) compound is selected from those compounds having at least two functional groups which generate carbene or nitrene under irradiation with radiation, i.e., photo-crosslinking agents.

Examples of the photo-crosslinking agents include diazidochalcone, 2,6-bis(4'-azidobenzal)cyclohexanone, 2,6-bis(4'-azidobenzal)-4-methylcyclohexanone, 1,3-bis(4'-azidobenzal)-2-propane, 1,3-bis(4'-azidocinnamylidene)-2-propanone, 4,4'-diazidostilbene and ammonium bichromate.

Of the above radiation-sensitive compounds, it is preferred to use a compound which generates radicals under irradiation with radiation as a photopolymerization initiator and a polyacryloyl compound as a photopolymerizable monomer or oligomer.

For example, 2-methyl[4-(methylthio)phenyl]-2-morpholino-1-propan-1-one or 2-benzyl-2-dimethylamino-1-(4-morpholinophenyl)-butan-1-one is used as a photopolymerization initiator, and pentaerythritol triacrylate or dipentaerythritol hexaacrylate is used as a photopolymerizable monomer or oligomer. In this case, the amount of the photopolymerization initiator per 100 parts by weight of the photopolymerizable monomer or oligomer is 0.01 to 200 parts by weight, preferably 1 to 120 parts by weight.

The radiation-sensitive compound may be used in any amount as far as the first composition can form a coating having an adhesion under irradiation with radiation, and yet the amount of the radiation-sensitive compound per 100 parts by weight of the alkali-soluble block copolymer (A) is preferably 5 to 500 parts by weight, more preferably 20 to 200 parts by weight. When this amount is less than 5 parts by weight, the clearness of pixels is liable to be insufficient. When it exceeds 500 parts by weight, a resin is liable to remain on a non-pixel portion.

The pigment (C) is selected from both organic pigments and inorganic pigments.

As organic pigments, preferred are dyes and pigments which are insoluble in water or an organic solvent. Specific examples of the organic pigments are described in chapter "Pigment" under "Color Index" (published by The Society of Dyers and Colourists).

An inorganic pigments, preferred are metal-containing compounds such as metal oxides and metal complex salts. Specific examples of the inorganic pigments include oxides of iron, cobalt, aluminum, cadmium, lead, copper, titanium, magnesium, chromium, zinc and antimony and composite oxides of these.

Specifically, the pigment (C) includes the following.

C. I. Pigment Yellow 24
C. I. Pigment Yellow 31
C. I. Pigment Yellow 53
C. I. Pigment Yellow 83
C. I. Pigment Orange 43
C. I. Pigment Red 105
C. I. Pigment Red 149
C. I. Pigment Red 176
C. I. Pigment Red 177
C. I. Pigment Violet 14
C. I. Pigment Violet 29
C. I. Pigment Blue 15
C. I. Pigment Blue 15:3
C. I. Pigment Blue 22
C. I. Pigment Blue 28
C. I. Pigment Green 15
C. I. Pigment Green 25
C. I. Pigment Green 36
C. I. Pigment Brown 28
C. I. Pigment Black 1
C. I. Pigment Black 7

The amount of the pigment (C) per 100 parts by weight of the alkali-soluble block copolymer (A) is 10 to 1,000 parts by weight, preferably 20 to 500 parts by weight. When this amount is less than 10 parts by weight, the color density in a pixel portion is liable to be insufficient. When it exceeds 1,000 parts by weight, a surface soiling and a resin-remaining are liable to occur on a non-pixel portion.

The first composition of the present invention may further contain other additives as required in addition to the above components (A), (B) and (C).

The above "other additives" include a filler, other polymer compound, a surfactant, an adhesion promoter, an antioxidant, an ultraviolet light absorber, an aggregation preventer and a sensitizer.

Specific examples of the other additives include fillers such as glass and alumina; polymer compounds such as polyvinyl alcohol, polyacrylic acid, polyethylene glycol monoalkyl ether and polyfluoroalkyl acrylate; nonionic, cationic and anionic surfactants: adhesion promoters such as vinyltrimethoxysilane, vinyltriethoxysilane, vinyltris(2-methoxyethoxy)silane, N-(2-aminoethyl)3-aminopropylmethyldimethoxysilane, N-(2-aminoethyl)3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane; antioxidants such as 2,2-thiobis(4-methyl-6-t-butylphenol) and 2,6-di-t-butylphenol; ultraviolet light absorbers such as 2-(3-t-butyl-5-methyl-2-hydroxyphenyl)-5-chlorobenzotriazole and alkoxybenzophenone; aggregation preventers such as sodium polyacrylate and sodium polymethacrylate; and sensitizers such as benzophenone, 4,4'-bis(dimethylamino) benzophenone, 4,4'-bis(diethylamino)benzophenone and nitropyrene.

The solvent for dissolving the first composition of the present invention is preferably selected from alcohols such as methyl alcohol, ethyl alcohol, n-propyl alcohol and i-propyl alcohol; cellosolves such as methyl cellosolve and ethyl cellosolve; carbitol type solvents such as diethylene glycol methyl ether and diethylene glycol ethyl ether; esters such as ethyl acetate, butyl acetate, methyl methoxypropionate, ethyl ethoxypropionate and ethyl lactate; ketones such as acetone, methyl isobutyl ketone and cyclohexanone; cellosolve acetates such as methylcellosolve acetate and ethylcellosolve acetate: carbitol acetate solvents such as diethylene glycol methyl acetate and diethylene glycol ethyl acetate; ethers such as diethyl ether, ethylene glycol dimethyl ether, diethylene glycol diethyl ether (diglyme) and tetrahydrofuran; aprotic amide solvents such as N,N-dimethylformamide, N,N-dimethylacetamide and N-methylpyrrolidone; lactones such as T-butyrolactone, aromatic hydrocarbons such as benzene, toluene, xylene and naphthalene; and saturated hydrocarbons such as n-heptane, n-hexane and n-octane.

The first composition of the present invention can be prepared by mixing and dispersing the above components (A), (B) and (C) and optionally other additives(s) in the presence of the solvent by means of a ball mill, a pebble mill, a shaker, a homogenizer, a three-roll mill or a sand mill.

The substrate used for forming a color filter from the so-prepared first composition of the present invention includes soda glass, Pyrex glass, quartz glass and products prepared by forming a transparent electrically conductive coating on these glasses, which are used in a liquid crystal device, and a photoelectric transfer device substrate used in a solid camera device such as a silicon substrate.

According to the present invention, secondly, there is similarly provided a pigment-dispersed color-filter composition (to be referred to as "second composition" hereinafter) comprising:

(A') a binder polymer, (B) a radiation-sensitive compound, (C) a pigment, and (D) a liquid medium containing at least 50% by weight of at least one organic medium which has a boiling point, measured at atmospheric pressure, of 100° to 200° C. and a vapor pressure, measured at 20° C., of 0.05 to 10 mmHg and is selected from the group consisting of an ester, and ether and a ketone.

The above second composition, when formed into a coating, gives a color filter having little difference in thickness between its central portion and its marginal portion and having excellent surface smoothness.

In the second composition, as the binder polymer (A'), preferred is a copolymer (e.g., random copolymer or block copolymer) obtained from an acid monomer (A'-1) and a comonomer (A'-2) copolymerizable with this acid monomer. The above acid monomer (A'-1) include unsaturated carboxylic acids having at least one carboxylic acid in the molecule such as unsaturated monocarboxylic acids and unsaturated dicarboxylic acids and unsaturated sulfonic acids having at least one sulfonic acid in the molecule. Specific examples of the unsaturated carboxylic acid include (meth)acrylic acid, crotonic acid, iraconic acid, maleic acid and fumaric acid.

Examples of the unsaturated sulfonic acids include isoprenesulfonic acid and styrenesulfonic acid.

The above acid monomers may be used alone or in combination.

Specific examples of the comonomer (A'-2) include aromatic vinyl compounds such as styrene, α-methylstyrene and vinyltoluene; unsaturated carboxylic acid alkyl esters such as methyl (meth)acrylate, ethyl (meth)acrylate, butyl (meth)acrylate, 2-hydroxyethyl (meth)acrylate and benzyl (meth)acrylate; unsaturated carboxylic acid aminoalkyl esters such as aminoethyl acrylate; unsaturated carboxylic acid glycidyl esters such as glycidyl (meth)acrylate; carboxylic acid vinyl esters such as vinyl acetate and vinyl propionate; vinyl cyanide compounds such as (meth) acrylonitrile and α-acrylonitrile; aliphatic conjugated dienes such as 1,3-butadiene and isoprene; and. macromonomers such as polystyrene, polymethyl (meth)acrylate, polybutyl (meth)acrylate and polysilicone all of which have terminal (meth)acryloyl groups.

The above comonomers may be used alone or in combination.

When the binder polymer (A') is formed, the amount of the above acid monomer (A'-1) per 100% by weight of the total monomer amount is preferably 15 to 50% by weight, more preferably 20 to 40% by weight.

Specific examples of the above binder polymer (A') include a benzyl methacrylate/methacrylic acid/styrene copolymer, a methyl methacrylate/methacrylic acid/styrene copolymer, a benzyl methacrylate/methacrylic acid/polystyrene macromonomer copolymer and a methyl methacrylate/methacrylic acid/polystyrene macromonomer copolymer.

As the binder polymer (A'), preferred also is an alkali-soluble block copolymer composed of a block having an acid group and a block having no acid group. This alkali-soluble block copolymer includes those described regarding the first composition. For example, preferred is a block copolymer having, as a block having an acid group, a polymer selected from the group consisting of a homopolymer obtained from a monomer having an acid group, a copolymer obtained from monomers having acid groups and a copolymer obtained from a monomer having an acid group and a monomer having no acid group.

The binder polymer (A') having a structural unit derived from the above acid monomer (A'-1) exhibits solubility in an alkali.

The binder polymer (A') obtained from the acid monomer (A'-1) particularly in the above amount has excellent solubility in an alkali developer solution and forms almost no undissolved substance. Thus, almost no surface soiling or resin-remaining occurs on a non-pixel portion on a substrate. Further, the binder polymer (A') is not excessively dissolved in an alkali developer solution, and can serve to form color pixels which have excellent adhesion to a substrate and hardly peel off the substrate.

When measured by gel permeation chromatography (GPC, using THF as a carrier), the weight average molecular weight, as a polystyrene, of the binder polymer (A') used in the second composition is preferably 10,000 to 500,000, more preferably 20.000 to 300,000, particularly preferably 30,000 to 300,000.

The binder polymer (A') having the above molecular weight hardly causes a scumming (refuse on a surface) around color pixels in development, and can serve to form pixels having sharp pattern edges. Further, it hardly causes the remaining of a resin on a non-pixel portion on a substrate and hardly causes a surface soiling and resin-remaining. Further, the above binder polymer (A') serves to increase the development time during which the development can be carried out under optimum conditions, and thus increase the margin of development time.

In the second composition, the radiation-sensitive compound (B) can be selected from those described regarding the first composition.

In the second composition, the photopolymerization initiator, photopolymerizable monomer, photopolymerizable oligomer and photo-crosslinking agent, all of which are described regarding the first composition, may be used alone or in combination, and particularly, it is preferred to use the photopolymerization initiator and either the photopolymerizable monomer or photopolymerizable oligomer in combination.

The amount of the radiation-sensitive compound (B) per 100 parts by weight of the binder polymer (A') is generally 5 to 500 parts by weight, preferably 20 to 200 parts by weight.

When the photopolymerization initiator and either the photopolymerizable monomer or photopolymerizable oligomer is used in combination, the amount of the photopolymerization initiator per 100 parts by weight of the photopolymerizable monomer or oligomer is 0.01 to 200 parts by weight, preferably 1 to 120 parts by weight.

Further, in the second composition, the pigment (C) can be selected from those described regarding the first composition.

In the second composition, the amount of the pigment (C) per 100 parts by weight of the binder polymer (A') is generally 10 to 1,000 parts by weight, preferably 20 to 500 parts by weight.

Further, the liquid medium (D) used in the second composition contains at least 50% by weight of an organic medium. The organic medium refers to an ester, an ether and a ketone which have a boiling point, measured at atmospheric pressure, of 100° to 200° C. and a vapor pressure, measured at 20° C., of 0.05 to 10 mmHg.

The above ester, ether and ketone specifically include the following:

Saturated aliphatic monocarboxylic acid alkyl esters such as n-butyl acetate and isobutyl acetate;

Lactic acid esters such as methyl lactate and ethyl lactate;

Oxyacetic acid alkyl esters such as methyl oxyacetate, ethyl oxyacetate and butyl oxyacetate;

Alkoxyacetic acid alkyl esters such as methyl methoxyacetate, ethyl methoxyacetate, butyl methoxyacetate, methyl ethoxyacetate and ethyl ethoxyacetate;

3-Oxypropionic acid alkyl esters such as methyl 3-oxypropionate and ethyl 3-oxypropionate;

3-Alkoxypropionic acid alkyl esters such as methyl 3-methoxypropionate, ethyl 3-methoxypropionate, methyl 3-ethoxypropionate and ethyl 3-ethoxypropionate;

2-Oxypropionic acid alkyl esters such as methyl 2-oxypropionate, ethyl 2-oxypropionate and propyl 2-oxypropionate;

2-Alkoxypropionic acid alkyl esters such as methyl 2-methoxypropionate, ethyl 2-methoxypropionate, propyl 2-methoxypropionate, methyl 2-ethoxypropionate and ethyl 2-ethoxypropionate;

2-Oxy-2-methylpropionic acid alkyl esters such as methyl 2-oxy-2-methylpropionate and ethyl 2-oxy-2-methylpropionate;

Monooxymonocarboxylic acid alkyl esters such as methyl 2-methoxy-2-methylpropionate and ethyl 2-ethoxy-2-methylpropionate;

Ketonic acid esters such as ethyl pyruvate;

Cellosolve acetates such as methylcellosolve acetate, ethylcellosolve acetate and diethylcellosolve acetate;

Ethers such as dichloroethyl ether, n-butyl ether, diisoamyl ether and methyl phenyl ether;

Carbitols such as methyl ethyl carbitol, diethyl carbitol, diethylene glycol methyl ethyl ether, diethylene glycol dimethyl ether and diethylene glycol diethyl ether;

Ketones such as cyclohexanone, methyl-n-propyl ketone, methyl-n-butyl ketone, methyl-n-amyl ketone and 2-heptanone.

The above organic media may be used alone or in combination.

The above ester, ether or ketone contained in the liquid medium (D) has a boiling point of 100° to 200° C. as described above, and preferred are organic media having a boiling point of 130° to 190° C.

The above ester, ether or ketone has a vapor pressure of 0.05 to 10.0 mmHg, and preferred are organic media having a vapor pressure of 0.1 to 5.0 mmHg.

Specific examples of the organic solvent preferably include ethyl lactate, methyl 3-methoxypropionate, ethyl 3-ethoxypropionate, ethyl 2-ethoxypropionate, methylcellosolve acetate, ethylcellosolve acetate, diethylene glycol dimethyl ether, diethylene glycol diethyl ether and propylene glycol monomethyl ether acetate.

The liquid medium (D) contains at least 50% by weight, preferably at least 70% by weight, of at least one of the above ester, ether and ketone.

In addition to at least one of the above ester, ether and ketone, the liquid medium (D) contains other solvent, and this "other solvent" can be selected from any solvents which can disperse or dissolve the above pigment (C), the binder polymer (A') and the radiation-sensitive compound (B).

When the liquid medium (D) contains more than 50% by weight of a solvent whose boiling point is higher than 200° C., the liquid medium (D) is not sufficiently evaporated in prebaking a coating and remains in the dry coating. As a result, the dry coating surface may have the property of adhesion and cause sticking, and the heat resistance of the dry coating may decrease. Further, when a large amount of the liquid medium (D) remains in the dry coating, the dry coating may peel off a glass substrate, particularly a glass substrate having an $SiO_2$ film on the surface, during the development.

On the other hand, when the liquid medium (D) contains more than 50% by weight of a solvent whose boiling point is lower than 100° C., it is difficult to apply the radiation-sensitive composition evenly and uniformly, and as a result, it is difficult to obtain a dry coating having excellent surface smoothness.

In the second composition, the amount of the liquid medium (D) per 100 parts by weight of the binder polymer (A') is generally 100 to 10,000 parts by weight, preferably 500 to 5,000 parts by weight.

The second composition of the present invention may contain other additives as required, such as a filler, other polymer compound, a surfactant, an adhesion promoter, an antioxidant, an ultraviolet absorber, an aggregation preventer and other sensitizer.

The above "other additives" include those described regarding the first composition.

The second composition of the present invention can be prepared by dissolving or dispersing the above components (A'), (B), (C) and (D) and optionally other component(s).

When the second composition is used, the organic solvent is sufficiently evaporated in a prebaking step, and there is no case where a large amount of the organic solvent remains in the dry coating. Therefore, the dry coating surface does not at all have the property of adhesion and does not cause sticking. Further, since no organic solvent remains in the dry coating in a large amount, the dry coating does not peel off the substrate, nor does the heat resistance decrease.

Further, the second composition can be evenly and uniformly applied onto a glass substrate with a spin coater. Therefore, the second composition can form a dry coating having a uniform thickness and having an excellently smooth surface without causing striation. Moreover, the so-formed dry coating has excellent adhesion to the substrate.

The above dry coating is developed with an alkali to give a color filter having excellent transparency.

When the second composition of the present invention is used, color filters having excellent transparency can be produced at high yields.

For forming pixels from the radiation-sensitive color-filter composition in the present invention, it is preferred to use an alkaline solution of at least one member selected from inorganic alkalis such as sodium carbonate, potassium hydroxide and potassium carbonate and organic alkalis such as tetramethylammonium hydroxide.

According to the present invention, thirdly, there is similarly provided a pigment-dispersed color-filter composition (to be referred to as "third composition" hereinafter) comprising:

(A') a binder polymer, (B) a radiation-sensitive compound, (C) a pigment, (D) an organic medium, and (E) an organic carboxylic acid having a molecular weight of 1,000 or less and having at least one acid group in the molecule.

The above third composition is free of a remaining undissolved substance of this composition on a non-pixel portion on a substrate when a color filter is formed, and thus gives a color filter in which color pixels having excellent adhesion to a substrate are evenly and uniformly formed on the substrate.

In the third composition, the binder polymer (A'), the radiation-sensitive compound (B) and the pigment (C) can be selected from those described regarding the second composition.

It should be understood that the amounts of the radiation-sensitive compound (B) and the pigment (C) based on the binder polymer (A') are the same as those described regarding the second composition.

In the third composition, the organic medium (D) is selected from those described regarding the First composition.

Of those organic solvent, preferred are cellosolve acetates such as methoxyethyl acetate, ethoxyethyl acetate and ethylcellosolve acetate. carbitol acetate type solvents such as methoxyethoxyethyl acetate and ethoxyethoxyethyl acetate, ethers such as ethylene glycol dimethyl ether. diethylene glycol diethyl ether and propylene glycol diethyl ether and esters such as methyl methoxypropionate, ethyl ethoxypropionate and ethyl lactate.

In the third composition, the amount of the organic medium (D) per 100 parts by weight of the binder polymer (A') is 100 to 10,000 parts by weight, preferably 500 to 5,000 parts by weight.

The organic carboxylic acid (E) used in the third composition has a molecular weight of 1,000 or less and has at least one acid group in the molecule. Specifically, the organic carboxylic acid (E)is selected from aliphatic carboxylic acids and phenyl group-containing carboxylic acids.

Specific examples of the aliphatic carboxylic acids include monocarboxylic acids such as formic acid, acetic acid, propionic acid, lactic acid, valeric acid, pivalic acid, caproic acid, diethylacetic acid, enanthic acid and caprilic acid; dicarboxylic acids such as oxalic acid, malonic acid, succinic acid. glutaric acid, adipic acid, pimelic acid, suberic acid. azelaic acid, sebacic acid, brassylic acid, methylmalonic acid, ethylmalonic acid, dimethylmalonic acid, methylsuccinic acid, tetramethylsuccinic acid, cyclohexanedicarboxylic acid, iraconic acid, citraconic acid, maleic acid and fumaric acid; and tricarboxylic acids such as tricarballylic acid, aconitic acid and camphotonic acid.

Examples of the phenyl group-containing carboxylic acids include carboxylic acids in which a carboxyl group directly bonds to a phenyl group and carboxylic acids in which a carboxyl group is bond to a phenol group through a carbon bond.

Specific examples of the above phenyl group-containing carboxylic acids include monocarboxylic acids such as benzoic acid, toluic acid, cuminic acid, hemellitic acid and mesitylenic acid; polycarboxylic acids such as phthalic acid, isophthalic acid, terephthalic acid, trimellitic acid, trimesic acid, mellophanic acid and pyromellitic acid; phenyl acetic acid, hydratropic acid, hydrocinnamic acid, mandelic acid, phenylsuccinic acid, atrophic acid, cinnamic acid, methyl cinnamate, benzyl cinnamate, cinnamylideneacetic acid, coumaric acid and unbellic acid.

Of the above acids, preferred are aliphatic or aromatic dicarboxylic acids such as malonic acid, citraconic acid, iraconic acid, mesaconic acid, fumaric acid and phthalic acid.

The above organic carboxylic acids may be used alone or in combination.

The content of the above organic carboxylic acid (E) in the third composition is preferably 0.001 to 10% by weight, more preferably 0.01 to 1% by weight.

When the content of the organic carboxylic acid (E) is less than 0.001% by weight, it may be impossible to prevent the remaining of an undissolved substance on a non-pixel portion on a substrate. When, it exceeds 10% by weight, the adhesion between pixels and the substrate may decrease.

The third composition of the present invention may further contain other additives as required. Examples of the "other additives" include a filler, other polymer compound, a surfactant, an adhesion promoter, an anti-oxidant, an ultraviolet light absorber and an aggregation preventer.

The above "other" additives can be specifically selected from those described regarding the first composition.

The third composition of the present invention is a radiation-sensitive composition for forming a color filter, and can form a color filter without causing a remaining of an undissolved substance on a non-pixel portion on a substrate surface in development.

The color-filter radiation-sensitive composition of the present invention is used for producing a color filter by forming a color pixel on a substrate, preferably on a substrate having a light; shielding layer pattern thereon, by a photolithographic method. When a pixel is formed from the color-filter radiation-sensitive composition of the present invention, no undissolved substance of the color-filter radiation-sensitive composition remains on a non-pixel portion, and the so-formed pixel, i.e., color filter is excellent in adhesion to the substrate or the light shielding layer pattern.

The pixel formed from the third composition of the present invention does not at all peel off a substrate. Further, the so-formed color filter is excellent in transmittance and contrast, and such color filters can be produced from the third composition of the present invention at high yields.

In the present invention, when pixels are formed from the color-filter radiation-sensitive composition, it is preferred to use an alkaline solution of sodium carbonate, sodium hydroxide, potassium hydroxide or tetramethylammonium hydroxide as a developer solution.

The present invention will be further detailed hereinafter by reference to Examples, in which "%" stands for "% by weight" and "part" stands for "part by weight".

SYNTHESIS EXAMPLE 1

| | |
|---|---|
| Ethylcellosolve acetate | 100 parts |
| Methyl methacrylate | 25 parts |
| Methacrylic acid | 25 parts |
| Azoisobutyronitrile | 1 part |

The above materials were charged into an autoclave equipped with a stirrer, stirred at room temperature until a homogeneous mixture was formed, and its temperature was increased up to 80° C. Then, the mixture was kept at 80° C. for 3 hours, and then kept at 100° C. for 2 hours. The reaction mixture was cooled to room temperature to give a polymer solution A. During the above procedures, air was shut off the inside of the autoclave with nitrogen, and the mixture was continuously stirred. The yield of a polymer in the polymer solution A was 98%. The polymer (to be referred to as "polymer A" hereinafter, and to be similarly named hereinafter) in the polymer solution A had a weight average molecular weight as polystyrene (to be referred to as "weight average molecular weight" hereinafter) of 53,000 (measured by GPC using HLC-802A supplied by Toso Corp.)

| | |
|---|---|
| Ethylcellosolve acetate | 100 parts |
| Methyl methacrylate | 30 parts |
| Styrene | 18 parts |
| Glycidyl methacrylate | 2 parts |
| Azoisobutyronitrile | 2 parts |

Separately, the above materials were charged into an autoclave equipped with a stirrer, and a polymer solution B was obtained in the same manner as in the procedures for obtaining the polymer solution A. The yield of a polymer in the polymer solution B was 99% or more. The polymer B has a weight average molecular weight of 62,000.

Then, the polymer solution A and the polymer solution B in equal amounts were mixed and kept at 100° C. for 12 hours with stirring to promote a reaction between carboxyl group of the polymer A and glycidyl group of the polymer B, whereby a polymer solution C was obtained. The polymer C had a weight average molecular weight of 140,000.

SYNTHESIS EXAMPLE 2

| | |
|---|---|
| Diglyme | 200 parts |
| Benzyl acrylate | 50 parts |
| Methacrylic acid | 30 parts |
| Macromonomer AS-6*[1] | 20 parts |
| Azoisobutyronitrile | 1 part |

(*[1]: Polystyrene terminated with methacryloyl, average molecular weight 6,000, supplied by Toagosei Chemical Industries Co., Inc.)

The above materials were charged into an autoclave equipped with a stirrer, stirred at room temperature until a homogeneous mixture was formed and then, the temperature was raised up to 80° C. Then, the mixture was kept at 80° C. for 3 hours, and then kept at 100° C. for 2 hours. The reaction mixture was cooled to room temperature to give a polymer solution D. During the above procedures, air was shut off the autoclave interior with nitrogen, and the mixture was continuously stirred. The yield of a polymer in the polymer solution D was 98%. The polymer D had a weight average molecular weight of 65,000.

SYNTHESIS EXAMPLE 3

A polymer solution E was obtained in the same manner as in Synthesis Example 2 except that the temperature of 80° C. for keeping the mixture was changed to 70° C. The yield of a polymer in the polymer solution E was 98%. The polymer E had a weight average molecular weight of 120,000.

SYNTHESIS EXAMPLE 4

A polymer solution F was obtained in the same manner as in Synthesis Example 2 except that the temperature of 80° C. for keeping the mixture was changed to 60° C. The yield of a polymer in the polymer solution F was 98%. The polymer F had a weight average molecular weight of 270,000.

SYNTHESIS EXAMPLE 5

A polymer solution G was obtained in the same manner as in Synthesis Example 2 except that the amount of azoisobutyronitrile was changed to 3 parts and that the temperature of 80° C. for keeping the mixture was changed to 90° C. The yield of a polymer in the polymer solution G was 99%. The polymer G had a weight average molecular weight of 28,000.

SYNTHESIS EXAMPLE 6

| | |
|---|---|
| Toluene | 1,000 parts |
| Methyl methacrylate | 75 parts |
| Styrene | 25 parts |
| m-Butyllithium | 1 part |

A methyl methacrylate/styrene block copolymer was synthesized by the use of the above materials according to a method described in a piece of literature (C. W. brown & I. F. White, J. Appl. Polym. Sci., 16, 2671–2676, 1972), and then the ester group was hydrolyzed. The hydrolysis was controlled by adjusting the time for hydrolysis treatment, and as a result, a polymer H whose hydrolysis ratio was 38% was obtained. The polymer H had a weight average molecular weight of 130,000. 100 Parts of the polymer H was dissolved in 200 parts of ethylcellosolve to obtain a polymer solution H.

SYNTHESIS EXAMPLE 7

A polymer solution I was obtained in the same manner as in Synthesis Example 2 except that 10 parts of methacrylic acid out of 30 parts of methacrylic acid was replaced with 10 parts of styrenesulfonic acid. The yield of a polymer in the polymer solution I was 97 The polymer I had a weight average molecular weight of 53,000.

EXAMPLE 1

| | |
|---|---|
| C.I. Pigment Blue 15 | 15 parts |
| Pentaerythritol triacrylate | 20 parts |
| Irgacure 184*[2] | 3 parts |
| Polymer solution C obtained in Synthesis | |
| Example 1 | 60 parts |
| Bm-1000*[3] | 2 parts |
| Vinylmethoxysilane | 3 parts |
| Ethylcellosolve acetate | 300 parts |

(*[2]: 1-hydroxycyclohexyl phenyl ketone, supplied by Ciba Geigy.)
(*[3]: fluorine-containing nonionic surfactant, supplied by BM Chemie.)

The above materials were placed in a ball mill with 3 mmϕ steel balls in it, and mixed and dispersed for 18 hours.

The resultant dispersion was filtered through a filter having a pore diameter of 10 μm to give a dispersion of a composition of the present invention.

When the dispersion of the composition was stored in a dark place at room temperature for 1 week, no pigment precipitated, no polymer precipitated, and there was no change in viscosity. The dispersion remained uniform.

The above dispersion was coated on a glass substrate with a spin coater to form a dry coating having a thickness of 2 μm, and dried at 80° C. for 15 minutes to give a blue uniform coating. The so-formed coating was free of defects such as voids and roughened surface.

Further, the coating was exposed to a high-pressure mercury lamp at a light energy of 300 mJ/cm$^2$ through a photomask having a mask opening breadth of 10 to 100 μm for resolution evaluation, and developed with an aqueous solution containing 0.1% of tetramethylammonium hydroxide. The coating was rinsed with water and dried at 180° C. for 60 minutes.

The so-obtained pixel had a pattern formed of fine lines having a breadth of 10 to 100 μm, and was free of coating defects such as pinholes and toughened coating. When observed through a microscope, it was found that there was no nonuniform breadth of lines of the pattern and that the line edges were sharp. Further, neither the pigment nor the organic coating remained on a non-pixel portion, and the pixel was suitable as a color filter. Table 1 shows the evaluation results.

EXAMPLE 2

A dispersion of a composition was obtained in the same manner as in Example 1 except that the polymer solution C was replaced with the polymer solution D obtained in Synthesis Example 2. Table 1 shows the evaluation results.

EXAMPLE 3

A dispersion of a composition was obtained in the same manner as in Example 1 except that the polymer solution C was replaced with the polymer solution E obtained in Synthesis Example 3. Table 1 shows the evaluation results.

EXAMPLE 4

A dispersion of a composition was obtained in the same manner as in Example 1 except that the polymer solution C was replaced with the polymer solution F obtained in Synthesis Example 4. Table 1 shows the evaluation results.

EXAMPLE 5

A dispersion of a composition was obtained in the same manner as in Example 1 except that the polymer solution C was replaced with the polymer solution G obtained in Synthesis Example 5. Table 1 shows the evaluation results.

EXAMPLE 6

A dispersion of a composition was obtained in the same manner as in Example 1 except that the polymer solution C was replaced with the polymer solution H obtained in Synthesis Example 6. Table 1 shows the evaluation results.

EXAMPLE 7

A dispersion of a composition was obtained in the same manner as in Example 1 except that the polymer solution C was replaced with the polymer solution I obtained in Synthesis Example 7. Table 1 shows the evaluation results.

EXAMPLE 8

A dispersion of a pigment was obtained in the same manner as in Example 2 except that the C. I. Pigment Blue 15 was replaced with C. I. Pigment Red 177. Table 1 shows the evaluation results.

EXAMPLE 9

A dispersion of a pigment was obtained in the same manner as in Example 2 except that the C. I. Pigment Blue 15 was replaced with C. I. Pigment Green 36. Table 1 shows the evaluation results.

COMPARATIVE SYNTHESIS EXAMPLE 1

All the materials used in Synthesis Example 1, i.e.,

| | |
|---|---|
| Ethylcellosolve acetate | 200 parts |
| Methyl methacrylate | 55 parts |
| Methacrylic acid | 25 parts |
| Styrene | 18 parts |
| Glycidal methacrylate | 2 parts |
| Azoisobutyronitrile | 3 parts |

were charged into an autoclave equipped with a stirrer, stirred at room temperature until a uniform mixture was formed and thereafter, the temperature was increased up to 80° C. Then, the mixture was kept at 80° C. for 3 hours, and then kept at 100° C. for 2 hours. The reaction mixture was cooled to room temperature to give a polymer solution α. The yield of a polymer in the polymer solution was 99% or more. The polymer α had a weight average molecular weight of 92,000.

COMPARATIVE EXAMPLE 1

A dispersion of a composition was obtained in the same manner as in Example 1 except that the polymer solution C was replaced with the polymer solution α obtained in Comparative Synthesis Example 1.

TABLE 1

| | Ex. 1 | Ex. 2 | Ex. 3 | Ex. 4 | Ex. 5 | Ex. 6 | Ex. 7 | Ex. 8 | Ex. 9 | Comp. Ex. 1 |
|---|---|---|---|---|---|---|---|---|---|---|
| Clearness in pixel portion*4 | ◎ | ◎ | ◎ | ○ | ◎ | ○ | ◎ | ◎ | ◎ | Δ |
| Pixel peeling in development | ◎ | ○ | ◎ | ◎ | ○ | ◎ | ○ | ○ | ○ | ○ |
| Surface soiling on non-pixel portion | ○ | ◎ | ○ | ○ | ◎ | ○ | ◎ | ◎ | ◎ | X |
| Margin of development time*5 | ◎ | ○ | ◎ | ◎ | ○ | ○ | ○ | ○ | ○ | ○ |

◎ Excellent
○ Good
Δ Poor
X Defective
*4: A linear pixel having a line breadth of 10 μm was formed and at the same time it had a clear outline.
*5: A development time of at least 30 seconds was available for providing an optimum development state.

EXAMPLE 10

A light shielding layer having a desired form was formed on a soda glass substrate surface on which an $SiO_2$ film had been formed for preventing sodium ion elution. Then, a color-filter radiation-sensitive composition shown in Table 2 was coated on the light shielding layer with a spin coater to form a desired coating thickness of 1.5 μm, and the so-formed coating was prebaked at 80° C. for 10 minutes to obtain a dry coating.

TABLE 2

| | Compound | part |
|---|---|---|
| Pigment | C.I. Pigment Red 177 | 90 |
| Binder | Benzyl methacrylate/methacrylic acid/styrene copolymer (compositional weight ratio 65/25/10, weight average molecular weight 40,000) | 50 |
| Radiation-sensitive compound | Trimethylolpropane triacrylate (M-309, supplied by Toagosei Chemical Industries, Co., Inc.) | 40 |
| | 1-Hydroxycyclohexyl phenyl ketone (I-184, supplied by Japan Ciba Geigy) | 24 |
| Organic solvent | Ethyl 3-ethoxypropionate (boiling point; 170.1° C., vapor pressure; 1.5 mmHg) | 796 |

The above-obtained dry coating was measured with a tracer-method film thickness measuring apparatus (alpha-step 100, supplied by TENCOR) to show the following. The coating thickness was 1.45 to 1.50 μm, or the in-plane thickness variation of the coating (in-plane thickness difference) was 0.05 μm or less, and the coating surface roughness (unevenness) was about 100Å. The dry coating was excellent in transparency. Further, the dry coating had no striation.

Then, the dry coating was exposed to ultraviolet light at 400 mj/cm$^2$ from a high pressure mercury lamp through a photomask, and developed by immersing the dry coating in an aqueous solution containing 0.05% of sodium carbonate to give red pixels having a size of 100 μm×100 μm each.

The so-formed color pixels were observed through a differential polarization microscope to show high surface smoothness and hence, they were desirable for a color filter.

COMPARATIVE EXAMPLE 2

A dry coating was formed in the same manner as in Example 10 except that the organic solvent was replaced with diethylene glycol monoethyl ether (boiling point 202° C., vapor pressure 0.13 mmHg). That is, the radiation-sensitive composition shown in Table 3 was used.

TABLE 3

| | Compound | part |
|---|---|---|
| Pigment | C.I. Pigment Red 177 | 90 |
| Binder | Benzyl methacrylate/methacrylic acid/styrene copolymer (compositional weight ratio 65/25/10, weight average molecular weight 40,000) | 50 |
| Radiation-sensitive compound | Trimethylolpropane triacrylate (M-309, supplied by Toagosei Chemical Industries, Co., Inc.) | 40 |
| | 1-Hydroxycyclohexyl phenyl ketone (I-184, supplied by Japan Ciba Geigy) | 24 |
| Organic solvent | Diethylene glycol monoethyl ether | 796 |

The dry coating was measured in the same manner as in Example 10 to show the following. The coating thickness was 1.42 to 1.60 μm, or the in-plane thickness variation of the coating was 0.18 μm, and the coating surface roughness (unevenness) was about 500Å. The dry coating was not transparent.

The dry coating was also exposed in the same manner as in Example 10 to obtain red pixels having a size of 100 μm×100 μm each.

The so-formed color pixels were observed through a differential polarization microscope to show that they did not have high surface smoothness and hence, they were undesirable for a color filter.

COMPARATIVE EXAMPLE 3

A dry coating was formed in the same manner as in Example 10 except that the organic solvent was replaced with methyl ethyl ketone (boiling point 79.6° C., vapor pressure 71.2 mmHg). That is, the radiation-sensitive composition shown in Table 4 was used.

TABLE 4

| | Compound | part |
|---|---|---|
| Pigment | C.I. Pigment Red 177 | 90 |
| Binder | Benzyl methacrylate/methacrylic acid/styrene copolymer (compositional weight ratio 65/25/10, weight average molecular weight 40,000) | 50 |
| Radiation-sensitive compound | Trimethylolpropane triacrylate (M-309, supplied by Toagosei Chemical Industries, Co., Inc.) | 40 |
| | 1-Hydroxycyclohexyl phenyl ketone (I-184, supplied by Japan Ciba Geigy) | 24 |
| Organic solvent | Methyl ethyl ketone | 796 |

The dry coating was measured in the same manner as in Example 10 to show the following. The coating thickness was 1.26 to 1.61 μm, or the in-plane thickness variation of the coating was 0.35 μm, and the coating surface roughness (unevenness) was about 600Å.

The dry coating was not transparent. Further, the dry coating had striation.

The dry coating was also exposed in the same manner as in Example 10 to obtain red pixels having a size of 100 μm×100 μm each.

The so-formed color pixels were observed through a differential polarization microscope to show that they did not have high surface smoothness and hence, they were undesirable for a color filter.

EXAMPLE 11

A dry coating was formed in the same manner as in Example 10 except that the organic solvent was replaced with propylene glycol monomethyl ether (boiling point 140° C., vapor pressure 3.5 mmHg). That is, the radiation-sensitive composition shown in Table 5 was used.

TABLE 5

| | Compound | part |
|---|---|---|
| Pigment | C.I. Pigment Blue 15 | 90 |
| Binder | Benzyl methacrylate/methacrylic acid/styrene copolymer (compositional weight ratio 65/25/10, weight average molecular weight 40,000) | 50 |
| Radiation-sensitive compound | Trimethylolpropane triacrylate (M-309, supplied by Toagosei Chemical Industries, Co., Inc.) | 40 |
| | 1-Hydroxycyclohexyl phenyl ketone (I-184, supplied by Japan Ciba Geigy) | 24 |
| Organic solvent | Propylene glycol monomethyl ether acetate | 796 |

The dry coating was measured in the same manner as in Example 10 to show the following. The coating thickness was 1.50 to 1.59 μm, or the in-plane thickness variation of the coating was 0.09 μm or less, and the coating surface roughness (unevenness) was about 200Å.

The dry coating was excellent in transparency, and had no striation.

Then, the dry coating was also exposed in the same manner as in Example 10 to obtain blue pixels having a size of 100 μm×100 μm each.

The so-formed color pixels were observed through a differential polarization microscope to show that they had high surface smoothness and hence, they were desirable for a color filter.

EXAMPLE 12

A dry coating was obtained in the same manner as in Example 10 except that the color-filter radiation-sensitive composition was replaced with a color-filter radiation-sensitive composition shown in Table 6.

TABLE 6

| | Compound | part |
|---|---|---|
| Pigment | C.I. Pigment Red 177 | 90 |
| Binder | Benzyl methacrylate/methacrylic acid/styrene copolymer (compositional weight ratio 65/25/10, weight average molecular weight 40,000) | 50 |
| Radiation-sensitive compound | Dipentaerythritol pentacrylate (M-400, supplied by Toagosei Chemical Industries, Co., Inc.) | 40 |
| | 2-Benzyl-2-dimethylamino-1-(4-morpholionophenyl)-butan-1-one (I-369, supplied by Japan Ciba Geigy) | 24 |
| Organic solvent | Diethylene glycol dimethyl ether (boiling point; 159.8° C., vapor pressure 3.4 mmHg) | 710 |
| | Carbitol acetate (boiling point; 217.4° C., vapor pressure 0.1 mmHg) | 86 |

The dry coating was measured in the same manner as in Example 10 to show the following. The coating thickness was 1.50 to 1.59 μm, or the in-plane thickness variation of the coating was 0.09 μm or less, and the coating surface roughness (unevenness) was about 200Å.

The dry coating was excellent in transparency, and had no striation.

Then, the dry coating was also exposed in the same manner as in Example 10 to obtain red pixels having a size of 100 μm×100 μm each.

The so-formed color pixels were observed through a differential polarization microscope to show that they had high surface smoothness and hence, they were desirable for a color filter.

COMPARATIVE EXAMPLE 4

A dry coating was obtained in the same manner as in Example 10 except that the color-filter radiation-sensitive composition was replaced with a color-filter radiation-sensitive composition shown in Table 7.

TABLE 7

| | Compound | part |
|---|---|---|
| Pigment | C.I. Pigment Green 7 | 90 |
| Binder | Benzyl methacrylate/methacrylic acid/poly-styrene macromonomer copolymer | 50 |

TABLE 7-continued

| | Compound | part |
|---|---|---|
| | (polystyrene macromonomer: AS-6, supplied by Toagosei Chemical Industries Co., Ltd.) (compositional weight ratio 65/25/10, weight average molecular weight 40,000) | |
| Radiation-sensitive compound | Trimethylolpropane triacrylate (Biscoat 295, supplied by Osaka Organic Chemical Industry Ltd) | 40 |
| | 2-Benzyl-2-dimethylamino-1-(4-morpholionophenyl)-butan-1-one (I-369, supplied by Japan Ciba Geigy) | 24 |
| Organic solvent | Diethylene glycol dimethyl ether (boiling point; 159.8° C., vapor pressure 3.4 mmHg) | 316 |
| | n-butyl carbitol acetate (boiling point; 246.8° C., vapor pressure 0.1 mmHg or less) | 474 |

The dry coating obtained in the same manner as in Example 10 was not fully dried when prebaked at 80° C. for 10 minutes, and tackiness (stickiness on coating surface) was observed. Therefore, the coating was prebaked at 90° C. for 10 minutes to obtain a dry coating. The coating thickness was 1.32 to 1.50 μm, or the in-plane thickness variation of the coating was 0.18 μm or less, and the coating surface roughness (unevenness) was about 400Å.

The coating was not transparent, and had striation.

The dry coating was exposed in the same manner as in Example 10 to obtain green pixels having a size of 100 μm×100 μm each.

The so-formed pixels were observed through a differential polarization microscope to show that they did not have high surface smoothness and hence, they were undesirable for a color filter.

EXAMPLE 13

A dry coating was obtained in the same manner as in Example 10 except that the color-filter radiation-sensitive composition was replaced with a color-filter radiation-sensitive composition shown in Table 8.

TABLE 8

| | Compound | part |
|---|---|---|
| Pigment | C.I. Pigment Green 7 | 90 |
| Binder | Benzyl methacrylate/methacrylic acid/poly-styrene macromonomer copolymer (polystyrene macromonomer: AS-6, supplied by Toagosei Chemical Industries Co., Ltd.) (compositional weight ratio 65/25/10, weight average molecular weight 40,000) | 50 |
| Radiation-sensitive compound | Trimethylolpropane triacrylate (Biscoat 295, supplied by Osaka Organic Chemical Industry Ltd) | 40 |
| | 2-Benzyl-2-dimethylamino-1-(4-morpholionophenyl)-butan-1-one (I-369, supplied by Japan Ciba Geigy) | 24 |
| Organic solvent | Diethylene glycol dimethyl ether (boiling point; 159.8° C., vapor pressure 3.4 mmHg) | 570 |
| | n-Butylcarbitol acetate (boiling point; 246.8° C., vapor pressure 0.1 mmHg or less) | 220 |

The dry coating was measured in the same manner as in Example 10 to show the following. The coating thickness was 1.47 to 1.53 μm, or the in-plane thickness variation of the coating was 0.06 μm or less, and the coating surface roughness (unevenness) was about 200Å.

The dry coating was excellent in transparency, and had no striation.

Then, the dry coating was also exposed in the same manner as in Example 10 to obtain green pixels having a size of 100 μm×100 μm each.

The so-formed color pixels were observed through a differential polarization microscope to show that they had high surface smoothness and hence, they were desirable for a color filter.

EXAMPLE 14

A dry coating was obtained in the same manner as in Example 10 except that the color-filter radiation-sensitive composition was replaced with a color-filter radiation-sensitive composition shown in Table 9.

TABLE 9

| | Compound | part |
|---|---|---|
| Pigment | C.I. Pigment Green 7 | 90 |
| Binder | Benzyl methacrylate/methacrylic acid/polystyrene macromonomer copolymer (polystyrene macromonomer: AS-6, supplied by Toagosei Chemical Industries Co., Ltd.) (compositional weight ratio 65/25/10, weight average molecular weight 40,000) | 50 |
| Radiation-sensitive compound | Trimethylolpropane triacrylate (Biscoat 295, supplied by Osaka Organic Chemical Industry Ltd) | 40 |
| | 2-Benzyl-2-dimethylamino-1-(4-morpholionophenyl)-butan-1-one (I-369, supplied by Japan Ciba Geigy) | 24 |
| Organic solvent | Diethylene glycol dimethyl ether (boiling point; 159.8° C., vapor pressure 3.4 mmHg) | 570 |
| | Methyl ethyl ketone (boiling point; 79.6° C., vapor pressure 71.2 mmHg) | 220 |

The dry coating was measured in the same manner as in Example 10 to show the following. The coating thickness was 1.62 to 1.69 μm, or the in-plane thickness variation of the coating was 0.10 μm or less, and the coating surface roughness (unevenness) was about 200Å.

The dry coating was excellent in transparency, and had no striation.

Then, the dry coating was also exposed in the same manner as in Example 10 to obtain green pixels having a size of 100 μm×100 μm each.

The so-formed color pixels were observed through a differential polarization microscope to show that they had high surface smoothness and hence, they were desirable for a color filter.

COMPARATIVE EXAMPLE 5

A dry coating was obtained in the same manner as in Example 10 except that the color-filter radiation-sensitive composition-was replaced with a color-filter radiation-sensitive composition shown in Table 10.

TABLE 10

| | Compound | part |
|---|---|---|
| Pigment | C.I. Pigment Green 7 | 90 |
| Binder | Benzyl methacrylate/methacrylic acid/polystyrene macromonomer copolymer (polystyrene macromonomer: AS-6, supplied by Toagosei Chemical Industries Co., Ltd.) (compositional weight ratio 65/25/10, weight average molecular weight 40,000) | 50 |
| Radiation-sensitive compound | Trimethylolpropane triacrylate (Biscoat 295, supplied by Osaka Organic Chemical Industry Ltd) | 40 |
| | 2-Benzyl-2-dimethylamino-1-(4-morpholionophenyl)-butan-1-one (I-369, supplied by Japan Ciba Geigy) | 24 |
| Organic solvent | Diethylene glycol dimethyl ether (boiling point; 159.8° C., vapor pressure 3.4 mmHg) | 316 |
| | Methyl ethyl ketone (boiling point; 79.6° C., vapor pressure 71.2 mmHg) | 474 |

The dry coating was measured in the same manner as in Example 10 to show, the following. The coating thickness was 1.68 to 1.98 μm, or the in-plane thickness variation of the coating was 0.30 μm, and the coating surface roughness (unevenness) was about 400Å.

The coating was not transparent, and had striation.

The dry coating was exposed in the same manner as in Example 10 to obtain green pixels having a size of 100 μm×100 μm each.

The so-formed pixels were observed through a differential polarization microscope to show that they did not have high surface smoothness and hence, they were undesirable for a color filter.

EXAMPLE 15

A light shielding layer having a desired form was formed on a soda glass substrate surface on which an $SiO_2$ film had been formed for preventing sodium ion elution. Then, a color-filter radiation-sensitive composition shown in Table 11 was coated on the light shielding layer with a spin coater to form a desired coating thickness, and the so-formed coating was dried at 80° C. for 10 minutes, and then cooled. Then, the so-formed color filter layer was exposed to ultraviolet light at 400 mj/cm$^2$ from a high pressure mercury lamp through a photomask, and developed by immersing the substrate in an aqueous solution containing 0.05% of sodium carbonate to give red pixels having a size of 20 μm×20 μm each.

TABLE 11

| | Compound | part |
|---|---|---|
| Pigment | C.I. Pigment Red 177 | 90 |
| Binder | Benzyl methacrylate/methacrylic acid/styrene copolymer (compositional weight ratio 65/25/10, average molecular weight Mw 40,000) | 50 |
| Radiation-sensitive compound | Trimethylolpropane triacrylate (M-309, supplied by Toagosei Chemical Industries Co., Inc.) | 40 |
| | 1-Hydroxycyclohexyl phenyl ketone (I-184, supplied by Japan Ciba Geigy) | 24 |
| Solvent | Ethylcellosolve acetate | 790 |
| Organic acid | Oxalic acid | 6 |

The so-formed color pixels gave a color filter in which no undissolved substance remained in a non-pixel portion on the substrate.

The same color-filter radiation-sensitive composition as the above color-filter radiation-sensitive composition was allowed to stand at room temperature for 3 days, and then red pixels were formed in the same manner as above and developed by immersing the substrate in an aqueous solution containing 0.05% of sodium carbonate to give a color filter in which no undissolved substance remained in a non-pixel portion on the substrate.

COMPARATIVE EXAMPLE 6

Red pixels were formed in the same manner as in Example 15 except that the color-filter radiation-sensitive composition was replaced with a color-filter radiation-sensitive composition shown in Table 12.

TABLE 12

| | Compound | part |
|---|---|---|
| Pigment | C.I. Pigment Red 177 | 90 |
| Binder | Benzyl methacrylate/methacrylic acid/styrene copolymer (compositional weight ratio 65/25/10, average molecular weight Mw 40,000) | 50 |
| Radiation-sensitive compound | Trimethylolpropane triacrylate (M-309, supplied by Toagosei Chemical Industries Co., Inc.) | 40 |
| | 1-Hydroxycyclohexyl phenyl ketone (I-184, supplied by Japan Ciba Geigy) | 20 |
| Solvent | Ethylcellosolve acetate | 796 |

In the above-formed color pixels, an undissolved substance was formed in a non-pixel portion on the substrate.

When the concentration of sodium carbonate was increased to 0.5% the undissolved portion decreased in amount, but the formed pixels partly peeled off and the sharpness of the pixel edges declined.

EXAMPLE 16

Blue pixels were formed in the same manner as in Example 15 except that the color-filter radiation-sensitive composition was replaced with a color-filter radiation-sensitive composition shown in Table 13.

TABLE 13

| | Compound | part |
|---|---|---|
| Pigment | C.I. Pigment Blue 15 | 90 |
| Binder | Benzyl methacrylate/methacrylic acid/styrene copolymer (compositional weight ratio 65/25/10, average molecular weight Mw 40,000) | 50 |
| Radiation-sensitive compound | Dipentaerythritol pentaacrylate (M-400, supplied by Toagosei Chemical Industries Co., Inc.) | 40 |
| | 2,2-Dimethoxy-2-phenylacetophenone (I-651 supplied by Japan Ciba Geigy) | 20 |
| Solvent | Diethylene glycol dimethyl ether | 790 |
| Organic carboxylic acid | Itaconic acid | 6 |

The above-formed color pixels gave a color filter in which no undissolved substance remained in a non-pixel portion on the substrate.

Further, after the same color-filter radiation-sensitive composition as the above color-filter radiation-sensitive composition was allowed to stand at room temperature for 3 days in tile same manner as in Example 15, it gave a color filter in which no undissolved substance remained in a non-pixel portion on the substrate.

COMPARATIVE EXAMPLE 7

An attempt was made to form blue pixels in the same manner as in Example 15 except that the color-filter radiation-sensitive composition was replaced with a color-filter radiation-sensitive composition shown in Table 14.

TABLE 14

| | Compound | part |
|---|---|---|
| Pigment | C.I. Pigment Blue 15 | 90 |
| Binder | Benzyl methacrylate/methacrylic acid/styrene copolymer (compositional weight ratio 65/25/10, average molecular weight Mw 40,000) | 50 |
| Radiation-sensitive compound | Dipentaerythritol pentaacrylate (M-400, supplied by Toagosei Chemical Industries Co., Inc.) | 40 |
| | 2,2-Dimethoxy-2-phenylacetophenone (I-651 supplied by Japan Ciba Geigy) | 24 |
| Solvent | Diethylene glycol dimethyl ether | 646 |
| Organic carboxylic acid | Itaconic acid | 450 |

The above color-filter radiation-sensitive composition contained a large amount, as large as 15% by weight, of iraconic acid (organic carboxylic acid). Therefore, when a dry coating was developed with a sodium carbonate aqueous solution, both the pixel portion and the non-pixel portion were dissolved away in the sodium carbonate aqueous solution, and no pixels were formed.

Even when the concentration of sodium carbonate in an aqueous solution was decreased to 0.001%, there was no change in the result.

EXAMPLE 17

Green pixels were formed in the same manner as in Example 15 except that the color-filter radiation-sensitive composition was replaced with a color-filter radiation-sensitive composition shown in Table 15.

TABLE 15

| | Compound | part |
|---|---|---|
| Pigment | C.I. Pigment Green 7 | 90 |
| Binder | Benzyl methacrylate/methacrylic acid/styrene copolymer (compositional weight ratio 65/25/10, average molecular weight Mw 40,000) | 50 |
| Radiation-sensitive compound | Trimethylolpropane triacrylate (Biscoat 295, supplied by Osaka Organic Chemical Industry Ltd) | 40 |
| | 2,2-Dimethoxy-2-phenylacetophenone (I-651 supplied by Japan Ciba Geigy) | 24 |
| Solvent | Diethylene glycol dimethyl ether | 793 |
| Organic carboxylic acid | Phthalic acid | 3 |

The above-formed color pixels gave a color filter in which no undissolved substance remained in a non-pixel portion on the substrate.

Further, after the same color-filter radiation-sensitive composition as the above color-filter radiation-sensitive composition was allowed to stand at room temperature for 3 days in the same manner as in Example 15, it gave a color filter in which no undissolved substance remained in a non-pixel portion on the substrate.

EXAMPLE 18

Red pixels were formed in the same manner as in Example 15 except that the color-filter radiation-sensitive composition was replaced with a color-filter radiation-sensitive composition shown in Table 16.

TABLE 16

| | Compound | part |
|---|---|---|
| Pigment | C.I. Pigment Red 177 | 90 |
| Binder | Methacrylate/methacrylic acid/styrene copolymer (compositional weight ratio 65/25/10, average molecular weight Mw 40,000) | 50 |
| Radiation-sensitive compound | Trimethylolpropane triacrylate (M-309, supplied by Toagosei Chemical Industries Co., Inc.) | 40 |
| | 1-Hydroxycyclohexyl phenyl ketone (I-184 supplied by Japan Ciba Geigy) | 24 |
| Solvent | Ethylcellosolve acetate | 790 |
| Organic carboxylic acid | Malonic acid | 6 |

The above-formed color pixels gave a color filter in which no undissolved substance remained in a non-pixel portion on the substrate.

Further, after the same color-filter radiation-sensitive composition as the above color-filter radiation-sensitive composition was allowed to stand at room temperature for 3 days in the same manner as in Example 15, it gave a color filter in which no undissolved substance remained in a non-pixel portion on the substrate.

EXAMPLE 19

Green pixels were formed in the same manner as in Example 15 except that the color-filter radiation-sensitive composition was replaced with a color-filter radiation-sensitive composition shown in Table 17.

TABLE 17

| | Compound | part |
|---|---|---|
| Pigment | C.I. Pigment Green 7 | 90 |
| Binder | Benzyl methacrylate/methacrylic acid/polystyrene macromonomer (compositional weight ratio 65/25/10, average molecular weight Mw 40,000) | 50 |
| Radiation-sensitive compound | Trimethylolpropane triacrylate (Biscoat 295, supplied by Osaka Organic Chemical Industry Ltd) | 40 |
| | 2-Benzyl-2-dimethylamino-1-(4-morpholinophenyl-butan-1-one (I-369 supplied by Japan Ciba Geigy) | 24 |
| Solvent | Diethylene glycol dimethyl ether | 790 |
| Organic carboxylic acid | Citraconic acid | 6 |

The above-formed color pixels gave a color filter in which no undissolved substance remained in a non-pixel portion on the substrate.

Further, after the same color-filter radiation-sensitive composition as the above color-filter radiation-sensitive composition was allowed to stand at room temperature for 3 days in the same manner as in Example 15, it gave a color filter in which no undissolved substance remained in a non-pixel portion on the substrate.

EXAMPLE 20

Green pixels were formed in the same manner as in Example 15 except that the color-filter radiation-sensitive composition was replaced with a color-filter radiation-sensitive composition shown in Table 18.

TABLE 18

| | Compound | part |
|---|---|---|
| Pigment | C.I. Pigment Green 7 | 90 |
| Binder | Methacrylate/methacrylic acid/polystyrene macromonomer (compositional weight ratio 65/25/10, average molecular weight Mw 40,000) | 50 |
| Radiation-sensitive compound | Trimethylolpropane triacrylate (Biscoat 295, supplied by Osaka Organic Chemical Industry Ltd) | 40 |
| | 2-Benzyl-2-dimethylamino-1-(4-morpholinophenyl-butan-1-one (I-369 supplied by Japan Ciba Geigy) | 24 |
| Solvent | Diethylene glycol dimethyl ether | 790 |
| Organic carboxylic acid | Citraconic acid | 3 |
| | Mesaconic acid | 3 |

The above-formed color pixels gave a color filter in which no undissolved substance remained in a non-pixel portion on the substrate.

Further, after the same color-filter radiation-sensitive composition as the above color-filter radiation-sensitive composition was allowed to stand at room temperature for 3 days in the same manner as in Example 15, it gave a color filter in which no undissolved substance remained in a non-pixel portion on the substrate.

What is claimed is:

[1. A pigment-dispersed color-filter composition comprising an admixture of:

(A) an alkali-soluble block copolymer composed of a block having an acid group and a block having no acid group;

(B) a radiation-sensitive compound, (C) a pigment, (D) an organic medium, and (E) an aliphatic or aromatic dicarboxylic acid having a molecular weight of 1,000 or less.]

[2. The composition of claim 1, wherein the radiation-sensitive compound (B) is selected from the group consisting of a polymerization initiator which generates radicals under irradiation with radiation and is selected from a carbonium compound, an azo compound, an azide compound, an organic sulfur compound, a peroxide compound and a trihalomethane compound, and a photo-crosslinking agent having at least two functional groups which generate carbene or nitrene under irradiation with radiation.]

[3. The composition of claim 1, wherein the organic medium (D) is selected from the group consisting of ethyl lactate, methyl 3-methoxypropionate, ethyl 3-ethoxypropionate, ethyl 2-ethoxypropionate, methylcellosolve acetate, ethylcellosolve acetate, diethylene glycol dimethyl ether, diethylene glycol diethyl ether and propylene glycol monomethyl ether acetate.]

[4. The composition of claim 1, wherein the organic medium is present in an amount of at least 50% by wt. of the composition.]

[5. The composition of claim 1, wherein the aliphatic or aromatic dicarboxylic acid is selected from the group consisting of malonic acid, citraconic acid, itaconic acid, mesaconic acid, fumaric acid and phthalic acid.]

[6. The composition of claim 1, wherein the alkali-soluble block copolymer is a copolymer derived from benzyl methacrylate, methacrylic acid and polystyrene macromonomer, or a copolymer derived from methyl methacrylate, methacrylic acid and polystyrene macromonomer.]

*7. A pigment-dispersed color-filter composition comprising an admixture of:*

(*A*) *an alkali-soluble block copolymer composed of a block having an acid group and a block having no acid group;*

(*B*) *a radiation-sensitive composition comprising 1.) a polymerization initiator selected from the group consisting of a carbonium compound, an azide compound, an organic sulfur compound, a peroxide compound and a trihalomethane compound and 2.) a compound containing polyvalent unsaturated double bonds and is polymerized under irradiation with radiation;*

(*C*) *a pigment;*

(*D*) *an organic medium; and*

(*E*) *an aliphatic or aromatic dicarboxylic acid having a molecular weight of 1,000 or less.*

*8. The composition of claim 7, wherein the organic medium (D) is selected from the group consisting of ethyl lactate, methyl 3-methoxypropionate, ethyl 3-ethoxypropionate, ethyl 2-ethoxypropionate, methylcellosolve acetate, ethylcellosolve acetate, diethylene glycol dimethyl ether, diethylene glycol diethyl ether and propylene glycol monomethyl ether acetate.*

*9. The composition of claim 7, wherein the organic medium is present in an amount of at least 50% by weight of the composition.*

*10. The composition of claim 7, wherein the aliphatic or aromatic dicarboxylic acid is selected from the group consisting of malonic acid, citraconic acid, itaconic acid, mesaconic acid, fumaric acid and phthalic acid.*

*11. The composition of claim 7, wherein the alkali soluble block copolymer is a copolymer derived from benzyl methacrylate, methacrylic acid and polystyrene macromonomer, or a copolymer derived from methyl methacrylate, methacrylic acid and polystyrene macromonomer.*

* * * * *